United States Patent
Chen et al.

(10) Patent No.: US 8,093,883 B2
(45) Date of Patent: Jan. 10, 2012

(54) ION CURRENT MEASUREMENT DEVICE

(75) Inventors: Jui-Fang Chen, Taichung County (TW);
Cheng-Hung Chang, Hsinchu (TW);
Chung-Jung Chen, Hsinchu (TW);
Chien-Kuo Ko, Hsinchu (TW);
Chi-Chun Yao, Tainan (TW)

(73) Assignee: United Microelectronics Corp.,
Science-Based Industrial Park, Hsinchu
(TW)

( * ) Notice: Subject to any disclaimer, the term of this patent is extended or adjusted under 35 U.S.C. 154(b) by 733 days.

(21) Appl. No.: 12/246,982

(22) Filed: Oct. 7, 2008

(65) Prior Publication Data
US 2010/0085033 A1 Apr. 8, 2010

(51) Int. Cl.
*G01N 27/00* (2006.01)

(52) U.S. Cl. ....................................... 324/71.3

(58) Field of Classification Search ............ 324/71.3
See application file for complete search history.

(56) References Cited

U.S. PATENT DOCUMENTS
6,858,854 B2 * 2/2005 Keum et al. .............. 250/492.21
2006/0261819 A1 * 11/2006 Liu et al. ........................ 324/464

FOREIGN PATENT DOCUMENTS
TW 201015607 * 10/2008

* cited by examiner

*Primary Examiner* — Thomas Valone
(74) *Attorney, Agent, or Firm* — Winston Hsu; Scott Margo

(57) ABSTRACT

The invention provides an ion current measurement device for a tool having an ion source. The ion current measurement device comprises an ion collecting cup and a replaceable liner. The ion collecting cup is disposed in the tool and the ion collecting cup possesses a cup opening facing the ion source. The replaceable liner is disposed in the ion collecting cup and the replaceable liner entirely covers a continuous inner sidewall of the ion collecting cup.

19 Claims, 2 Drawing Sheets

ION CURRENT MEASUREMENT DEVICE

BACKGROUND OF THE INVENTION

1. Field of Invention

The present invention relates to a measurement device. More particularly, the present invention relates to an ion current measurement device.

2. Description of Related Art

Before the ion related process, such as ion implantation process, is performed, it is usually to measure the ion current of the ion beam produced by the ion source to confirm the actual ion current amount of the later performed ion related process. Currently, the most used ion current measurement device is Faraday housing (as known as Faraday cup).

Since the ion current measurement device collects total ions of the ion beam from the ion source in a time period for further calculating the actual ion current, the ions (or ion beam) is blocked inside the ion current measurement device before the ions can reach the target. And the blocked ions (ion beam) produce gases and further induce residual coating inside the ion current measurement device. Moreover, the residual coating is aggressively accumulated inside the ion current measurement device after several times of ion related process are performed. Hence, the residual pilling problem happens.

Furthermore, because of the huge amount of phosphorous ion residual coating on the inner wall of the ion current measurement device, it is easily to fire the phosphorous ion residual during the cleaning process, such as vacuuming or polishing. Thus, the cleaning process for cleaning the inner wall of the ion current measurement device induces serious public security problem.

SUMMARY OF THE INVENTION

Accordingly, the present invention is to provide an ion current measurement device capable of reducing the residual coating phenomenon happening in the ion collecting cup.

The present invention is further to provide a replaceable liner element capable of extending the life time of the ion current measurement device.

To achieve these and other advantages and in accordance with the purpose of the invention, as embodied and broadly described herein, the invention provides an ion current measurement device for a tool having an ion source. The ion current measurement device comprises an ion collecting cup and a replaceable liner. The ion collecting cup is disposed in the tool and the ion collecting cup possesses a cup opening facing the ion source. The replaceable liner is disposed in the ion collecting cup and the replaceable liner entirely covers a continuous inner sidewall of the ion collecting cup.

According to one embodiment of the present invention, the material of the replaceable liner includes a conductive material.

According to one embodiment of the present invention, the material of the replaceable liner includes graphite.

According to one embodiment of the present invention, the replaceable linner is conformal to the continuous inner sidewall and is seamlessly attached to the continuous inner sidewall.

According to one embodiment of the present invention, the ion collecting cup includes a Faraday housing.

According to one embodiment of the present invention, the replaceable liner has a fan leaf structure on the continuous inner sidewall.

According to one embodiment of the present invention, the ion current measurement device further comprises an opening shield disposed on a surface of the cup opening and covering an interface between the ion collecting cup and the replaceable liner.

According to one embodiment of the present invention, the replaceable liner and the opening shield are formed as a single-piece structure.

According to one embodiment of the present invention, the replaceable liner has a bottom portion opposite to the cup opening of the ion collecting cup.

According to one embodiment of the present invention, the bottom portion has a fan leaf structure.

The invention also provides a replaceable liner disposed in an ion collecting cup. The ion collecting cup has a continuous inner sidewall and a cup opening. The replaceable liner comprises a liner continuous sidewall and an opening shield. The liner continuous sidewall covers the continuous inner sidewall of the ion collecting cup. The opening shield is disposed on a surface of the cup opening and externally extending to cover an interface between the liner continuous sidewall and the continuous inner sidewall.

According to one embodiment of the present invention, the material of the replaceable liner includes a conductive material.

According to one embodiment of the present invention, the material of the replaceable liner includes graphite.

According to one embodiment of the present invention, the liner continuous sidewall is conformal to the continuous inner sidewall and is seamlessly attached on the continuous inner sidewall.

According to one embodiment of the present invention, the ion collecting cup includes a Faraday cup.

According to one embodiment of the present invention, the liner continuous sidewall has a fan leaf structure.

According to one embodiment of the present invention, the liner continuous sidewall and the opening shield are formed as a single-piece structure.

According to one embodiment of the present invention, the replaceable liner has a bottom portion opposite to the cup opening of the ion collecting cup.

According to one embodiment of the present invention, the bottom portion has a fan leaf structure.

In the present invention, since the replaceable liner, disposed insider the ion collecting cup, covers the continuous inner sidewall directly blocking the ions, the problems, such as residual pilling or cleaning difficulty, caused by the residual coating on the continuous inner sidewall of the ion current measurement device due to the gases produced by the blocked ions can be overcome. Further, the cleanliness of the ion collecting cup can be well maintained and the risk for cleaning the ion collecting cup is decreased.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
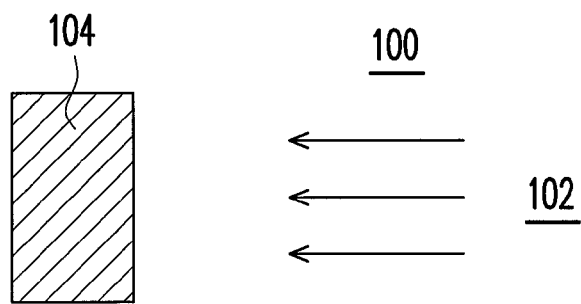
FIG. 1 is a schematic drawing showing a tool equipped with an ion current measurement device.

FIG. 1 is a schematic drawing showing a tool equipped with an ion current measurement device. As shown in FIG. 1, in a tool 100 equipped with an ion source device 102, an ion current measurement device 104 is provided. Before the later performed process, such as ion implantation process, is performed, the ion current measurement device 104 is used to measure the actual ion current within the tool 100. The tool 100 can be, for example but not limited to, an ion implantation machine.

Figure 2:
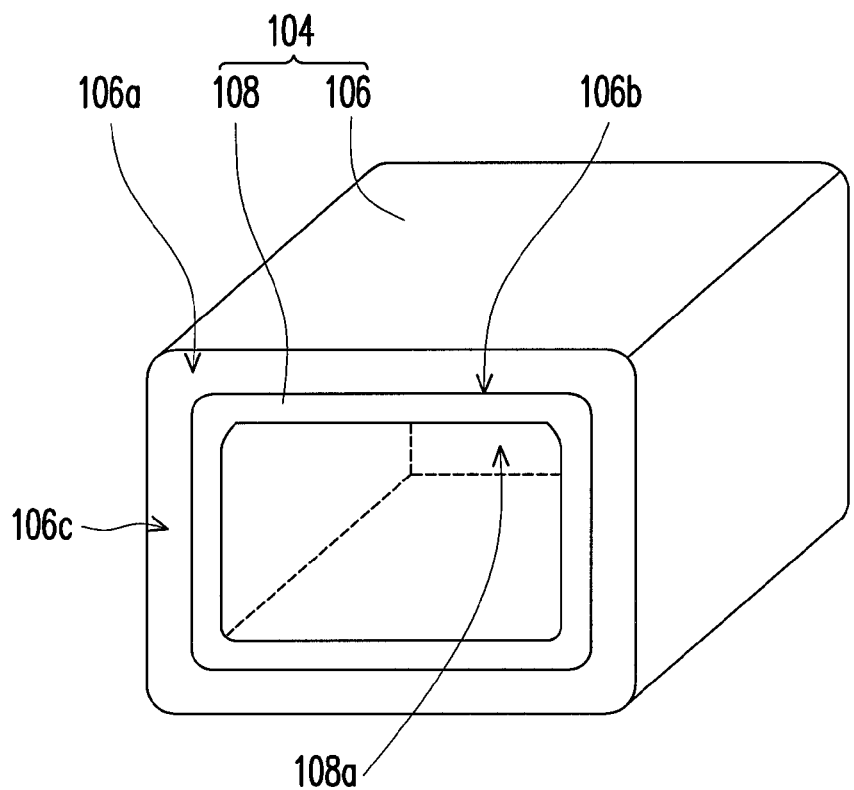
FIG. 2 is a three-dimensional view showing an ion current measurement device according to one embodiment of the present invention.

FIG. 2 is a three-dimensional view showing an ion current measurement device according to one embodiment of the present invention. As shown in FIG. 1 and FIG. 2, the aforementioned ion current measurement device 104 comprises an ion collecting cup 106 and a replaceable liner 108. It should be noticed that the ion collecting cup 106 is disposed in the tool 100 and the arrangement of the ion collecting cup 106 is that the cup opening 106a of the ion collecting cup 106 faces the ion source device 102. Moreover, the ion collecting cup 106 can be, for example but not limited to, a Faraday housing.

Furthermore, the replaceable liner 108 is disposed in the ion collecting cup 106 and the replaceable liner 108 entirely covers a continuous inner sidewall 106b of the ion collecting cup 106. Notably, the material of the replaceable liner 108 can be, for example, a conductive material. Furthermore, in one embodiment, the material of the replaceable liner 108 can be, for example, graphite. Additionally, the replaceable liner 108 is conformal to the continuous inner sidewall 106b of the ion collecting cup 106 and is seamlessly attached to the continuous inner sidewall. Since a liner continuous sidewall of the replaceable liner 108 is conformal to the continuous inner sidewall 106b of the ion collecting cup 106 and is seamlessly attached to the continuous inner sidewall 106b, the gases produced by the ions, which are blocked by the ion current measurement device 104, do not generate residual coating directly on the ion collecting cup 106 when the process for measuring the ion current is performed and the residual peeling or the residual cleaning difficulty happen on the inner sidewall of the ion collecting cup 106 due to the residual coating can be avoided.

Figure 3:
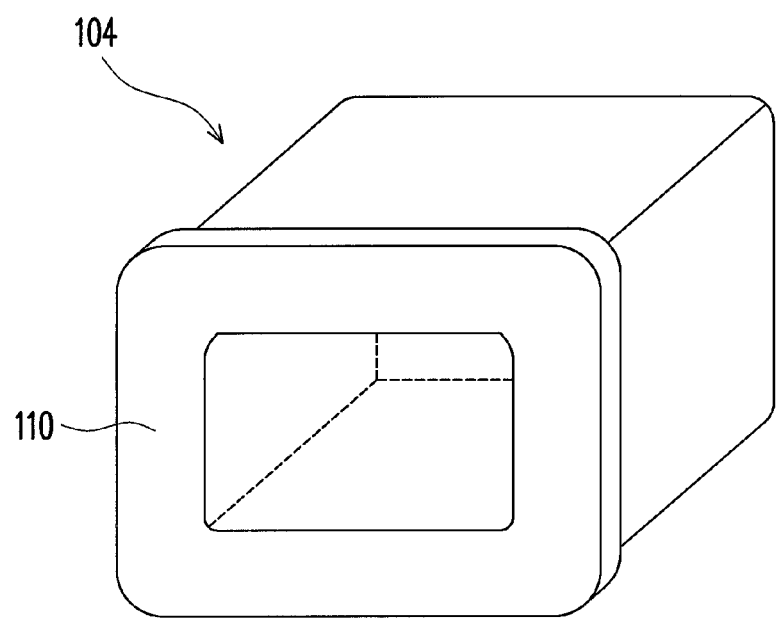
FIG. 3 is a three-dimensional view showing an ion current measurement device according to another embodiment of the present invention.

FIG. 3 is a three-dimensional view showing an ion current measurement device according to another embodiment of the present invention. As shown in FIG. 2 and FIG. 3, in another embodiment, the ion current measurement device 104 further comprises an opening shield 110. This opening shield 110 is disposed on a surface 106c of the cup opening 106a and covers an interface between the ion collecting cup 106 and the replaceable liner 108. That is, the opening shield 110 is disposed on the surface 106c of the cup opening 106a and further external extends so as to cover the interface between the liner continuous sidewall of the replaceable liner 108 and the continuous inner sidewall 106b of the ion collecting cup 106. As for the arrangement that the cup opening 106a of the ion collecting cup 106 faces the ion source 102, because the opening shield 110 covers the surface 106c of the cup opening 106a, which faces the ion source 102 and covers the interface between the replaceable liner 108 and the ion collecting cup 106, the gases produced by the ions, which are blocked by the ion current measurement device 104, do not generate residual coating directly on the surface 106c of the cup opening 106a or on the interface between the replaceable liner 108 and the ion collecting cup 106 when the process for measuring the ion current is performed and the residual peeling or the residual cleaning difficulty happen on the inner sidewall 106b of the ion collecting cup 106 due to the residual coating can be avoided.

In one embodiment, the aforementioned replaceable liner 108 and the opening shield 110 can be formed as a one-piece structure. Furthermore, the replaceable liner 108 can be a tube structure with two opening ends and without having a bottom portion. In another embodiment, the replaceable liner 108 can be, for example, having a bottom portion 108a (as shown in FIG. 2). This bottom portion 108a of the replaceable liner 108 is opposite to the cup opening 106a of the ion collecting cup 106.

Figure 4:
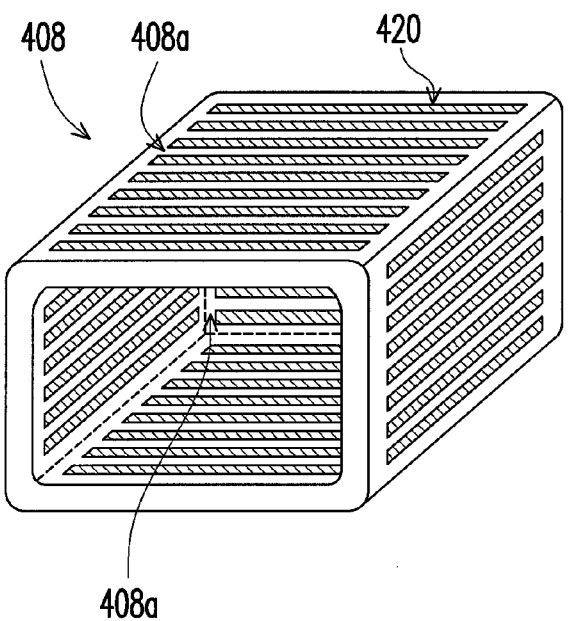
FIG. 4 is a three-dimensional view showing a replaceable liner according to the other embodiment of the present invention.

In one embodiment, the structure of the composed inner wall (including the continuous sidewall) of the replaceable liner 108 can be a solid structure. FIG. 4 is a three-dimensional view showing a replaceable liner according to the other embodiment of the present invention. As shown in FIG. 4, the composed sidewall, including liner continuous sidewall 408a and the bottom portion 408b, of the replaceable liner 408 can have a fan leaf structure 420 as shown in FIG. 4 so as to increase the contact area between the replaceable liner 408 and the incoming ions.

Notably, the arrangement of the fan leaf structure on inner wall of the replaceable liner 408 in the present invention is not limited to the arrangement of the fan leaf structure 420 shown in FIG. 4. On the other words, the type and the arrangement of the fan leaf structure 420 of the inner wall of the replaceable liner 408 are not limited to the strip type blinds and the parallel arrangements.

In the present invention, since the replaceable liner, disposed insider the ion collecting cup, covers the continuous inner sidewall directly blocking the ions, the problems, such as residual pilling or cleaning difficulty, caused by the residual coating on the continuous inner sidewall of the ion current measurement device due to the gases produced by the blocked ions can be overcome. Further, because the replaceable liner can be used as a liner layer for the continuous inner sidewall of the ion collecting cup, it is convenient for the user to replace the replaceable liner already suffering from the residual coating problems and the cleanliness of the ion collecting cup can be well maintained and the risk for cleaning the ion collecting cup is decreased.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. An ion current measurement device for a tool having an ion source, comprising:
    an ion collecting cup disposed in the tool, wherein the ion collecting cup possesses a cup opening facing the ion source; and
    a replaceable liner disposed in the ion collecting cup, wherein the replaceable liner entirely covers a continuous inner sidewall of the ion collecting cup.

2. The ion current measurement device of claim 1, wherein the material of the replaceable liner includes a conductive material.

3. The ion current measurement device of claim 1, wherein the material of the replaceable liner includes graphite.

4. The ion current measurement device of claim 1, wherein the replaceable linner is conformal to the continuous inner sidewall and is seamlessly attached to the continuous inner sidewall.

5. The ion current measurement device of claim 1, wherein the ion collecting cup includes a Faraday housing.

6. The ion current measurement device of claim 1, wherein the replaceable liner has a fan leaf structure on the continuous inner sidewall.

7. The ion current measurement device of claim 1 further comprising an opening shield disposed on a surface of the cup opening and covering an interface between the ion collecting cup and the replaceable liner.

8. The ion current measurement device of claim 7, wherein the replaceable liner and the opening shield are formed as a single-piece structure.

9. The ion current measurement device of claim 7, wherein the replaceable liner has a bottom portion opposite to the cup opening of the ion collecting cup.

10. The ion current measurement device of claim 9, wherein the bottom portion has a fan leaf structure.

11. A replaceable liner disposed in an ion collecting cup, wherein the ion collecting cup has a continuous inner sidewall and a cup opening, comprising:

a liner continuous sidewall covering the continuous inner sidewall of the ion collecting cup; and an opening shield disposed on a surface of the cup opening and externally extending to cover an interface between the liner continuous sidewall and the continuous inner sidewall.

12. The replaceable liner of claim 11, wherein the material of the replaceable liner includes a conductive material.

13. The replaceable liner of claim 11, wherein the material of the replaceable liner includes graphite.

14. The replaceable liner of claim 11, wherein the liner continuous sidewall is conformal to the continuous inner sidewall and is seamlessly attached on the continuous inner sidewall.

15. The replaceable liner of claim 11, wherein the ion collecting cup includes a Faraday cup.

16. The replaceable liner of claim 11, wherein the liner continuous sidewall has a fan leaf structure.

17. The replaceable liner of claim 11, wherein the liner continuous sidewall and the opening shield are formed as a single-piece structure.

18. The replaceable liner of claim 11, wherein the replaceable liner has a bottom portion opposite to the cup opening of the ion collecting cup.

19. The replaceable liner of claim 18, wherein the bottom portion has a fan leaf structure.

* * * * *